(12) United States Patent
Bettencourt

(10) Patent No.: US 8,198,942 B1
(45) Date of Patent: Jun. 12, 2012

(54) INTEGRATED THERMOELECTRIC PROTECTION CIRCUIT FOR DEPLETION MODE POWER AMPLIFIERS

(75) Inventor: John P. Bettencourt, Danvers, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/094,175

(22) Filed: Apr. 26, 2011

(51) Int. Cl.
*H02H 7/20* (2006.01)

(52) U.S. Cl. .................................. 330/298; 330/207 P

(58) Field of Classification Search .................. 330/298, 330/207 P, 307
See application file for complete search history.

(56) References Cited

U.S. PATENT DOCUMENTS

| | | | |
|---|---|---|---|
| 3,134,046 A * | 5/1964 | Walton | 315/30 |
| 4,787,686 A | 11/1988 | Tajima et al. | |
| 4,855,246 A | 8/1989 | Codella et al. | |
| 5,724,004 A | 3/1998 | Reif et al. | |
| 5,793,194 A | 8/1998 | Lewis | |
| 6,600,301 B1 | 7/2003 | DeFalco | |
| 6,943,631 B2 * | 9/2005 | Scherrer et al. | 330/310 |
| 7,161,419 B2 * | 1/2007 | Tei et al. | 330/9 |
| 2005/0279398 A1 | 12/2005 | Herrick et al. | |
| 2007/0125414 A1 | 6/2007 | Bettencourt | |

FOREIGN PATENT DOCUMENTS

JP 2001-24445 1/2001

OTHER PUBLICATIONS

Notification of Transmittal of the International Search Report and the Written Opinion of the International Searching Authority, or the Declaration, PCT/US2006/043486, date of mailing Apr. 19, 2007, 5 pages.

Written Opinion of the International Searching Authority, PCT/US2006/043486, date of mailing Apr. 19, 2007, 5 pages.
Chinese Office Action for Application No. 2006 80044799.8, 5 pages.
Dehé et al., Broadband Thermoelectric Microwave Power Sensors Using GaAs Foundry Process, 2002 IEEE MTT-S Digest, pp. 1829-1832, Germany.
Strasser et al.: "Micromachined CMOS Thermoelectric Generators As On-Chip Power Supply;" The $12^{th}$ Int'l Conf. on Solid State Sensors, Actuators and Microsystems; Boston, MA; Jun. 1002; pp. 45-48.
Strasser et al., "Micromachined CMOS thermoelectric generators as on-chip power supply", Transducers, Solid-State Sensors, Actuators and Microsystems, $12^{th}$ Innational Conference on 2003, Piscataway, NJ, USA, IEEE, vol. 1, Jun. 9, 2003, pp. 45-48, XP010646541. ISBN: 0/7803-7731-1.
Dehé et al., Institute of Electrical and Electronics Engineers: "GaAs Monolithic Integrated Microwave Power Sensor in Coplanar Waveguide Technology;" IEEE 1996 Microwave and Millimeter Wave Monolithic Circuits Symposium; Digest of Papers. San Francisco, Jun. 16-19, 1996. IEEE Microwave and Millimeter-Wave Monolithic Circuits Symposium. MMWMC, New Yor, IEEE, US, 1996, pp. 179-182, XP 000683222; ISBN: 0-7803-3360.
U.S. Appl. No. 11/291,371, filed Dec. 1, 2005, 14 pages.
U.S. Appl. No. 11/291,371, filed Dec. 1, 2005, 177 pages.

* cited by examiner

*Primary Examiner* — Henry Choe
(74) *Attorney, Agent, or Firm* — Daly, Crowley, Mofford & Durkee, LLP

(57) ABSTRACT

An amplifier having a depletion mode output transistor and a bias circuit coupled to a negative voltage supply. A thermopile is provided to bias the output transistor to an "off" condition in the event of failure of the negative supply voltage.

5 Claims, 2 Drawing Sheets

INTEGRATED THERMOELECTRIC PROTECTION CIRCUIT FOR DEPLETION MODE POWER AMPLIFIERS

TECHNICAL FIELD

This disclosure relates generally to power amplifiers and more particularly to power amplifiers having depletion mode, normally on, output transistors.

BACKGROUND

As is known in the art, RF power amplifiers having depletion mode, common source FET output transistors often use a separate transistor as a "drain switch" to turn on and off a DC drain supply power. An alternative to the use of a separate transistor as a "drain switch" is to use gate switching of the output transistor itself where a sufficiently negative voltage is supplied to the power amplifier's transistor gate to reduce the DC drain current to zero, shutting off the amplifier. A shortcoming of the gate switch is that during "amplifier bias up", proper gate control of the amplifier might not be readily established and the drain current of RF amplifier might go unchecked causing system damage.

SUMMARY

In accordance with the present disclosure, an amplifier is provided having: a depletion mode output transistor; a bias circuit coupled to a negative voltage supply; and a thermopile network responsive to a failure in the negative voltage supply to bias the output transistor to an "off" condition in the event of a sensed failure of the negative supply voltage.

The disclosure uses a circuit having a thermopile with a depletion mode FET switch. The circuit is integrated with the RF amplifier to protect the system during the "bias up" or "bias down" phase when a negative supply voltage might be interrupted. Thus, in accordance with the disclosure, a thermopile disables the RF output amplifier drain current when a negative voltage potential is not available. Normal operation resumes when negative supply is established.

In one embodiment, the depletion mode output transistor, the bias circuit and the thermopiles are formed on a common integrated circuit substrate.

In one embodiment, the thermopile network comprises: a switch transistor; and a thermopile having: a heating element coupled between: the supply of a positive reference potential; and a drain electrode of the depletion mode switch transistor; a first terminal connected to ground; and a second terminal coupled to: the gate electrode of the output transistor; and the bias circuit, such second electrode producing a potential negative relative to a potential produced at the first terminal when current passes through the heating element.

In one embodiment, during normal operation, the gate electrode of the switch transistor is electrically coupled to the supply of the negative reference potential turning "off" both the switch transistor and supply current through the heating element whereas, during a failure of the supply of the negative reference potential, voltage at the gate electrode of the switch transistor floats upward towards the positive reference potential turning the switch transistor "on" allowing current to flow through the heating element to produces a negative potential at the second terminal turning "off" the output transistor.

In one embodiment, an amplifier is provided having: a depletion mode output transistor having: a drain electrode coupled to a voltage supply having a positive reference potential relative to ground; a source electrode coupled to ground; and a gate electrode fed by a signal to be amplified by the output transistor; a depletion mode switch transistor having a gate electrode coupled to a supply of a negative reference potential and a source electrode coupled to ground; a dc bias circuit coupled to the gate electrode of the depletion mode output transistor; a thermopile having: a heating element coupled between: the supply of the positive reference potential; and a drain electrode of the depletion mode switch transistor; a first terminal connected to ground; and a second terminal coupled to: the gate electrode of the output transistor; and the bias circuit, such second electrode producing a potential negative relative to a potential produced at the first terminal when current passes through the heating element. During normal operation, the gate electrode of the switch transistor is electrically coupled to the supply of the negative reference potential turning "off" both the switch transistor and supply current through the heating element whereas, during a failure of the supply of the negative reference potential, voltage at the gate electrode of the switch transistor floats upward towards the positive reference potential turning the switch transistor "on" allowing current to flow through the heating element to produces a negative potential at the second terminal turning "off" the output transistor.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
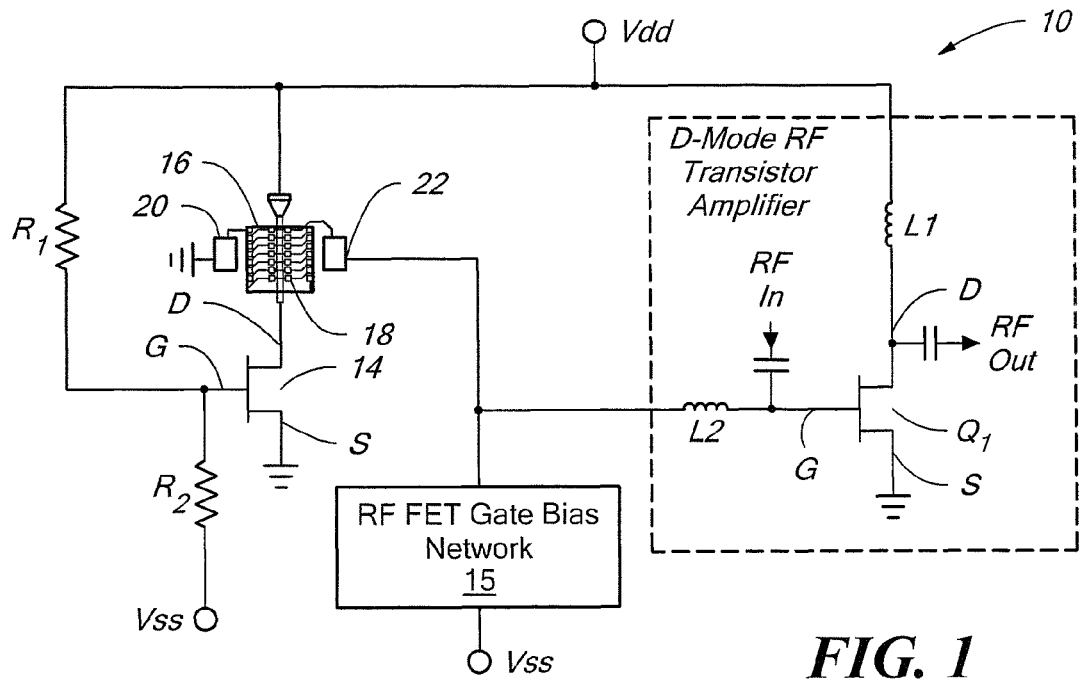
FIG. 1 is an amplifier according to the disclosure.

An amplifier 10 is shown having a depletion mode output transistor Q1. The depletion mode output transistor Q1 has: a drain electrode (D) coupled to a voltage supply, Vdd through an RF blocking inductor L1, having a positive reference potential relative to ground; a source electrode (S) coupled to ground; and a gate electrode (G) fed by a signal, here an RF signal via a dc blocking capacitor, as shown, to be amplified by the output transistor 12; a depletion mode switch transistor 14 having a gate electrode (G) coupled to a supply (Vss) of a negative reference potential and a source electrode (S) coupled to ground; a dc bias circuit 15 coupled to the gate electrode of the output transistor Q1 through an RF blocking inductor L2; a thermopile 16 having: a heating element 18 coupled between: the supply of the positive reference potential (Vdd); and a drain electrode (D) of the depletion mode switch transistor 12; a first terminal 20 connected to ground; and a second terminal 22 coupled to: the gate electrode (G) of the output transistor 12; and the dc bias circuit 15, such second electrode 22 producing a potential negative relative to a potential produced at the first terminal 20 when current passes through the heating element 18. A pull-up resistor R1 is connected between the positive reference potential (Vdd) and the gate electrode (G) of the transistor 14 and a current limiting resistor R2 is connected between the gate electrode (G) of transistor 14 and the negative supply Vss. It is noted that the resistance of R1 is much greater than the resistance of the heating element 18 of the thermopile 16.

Figure 1A:
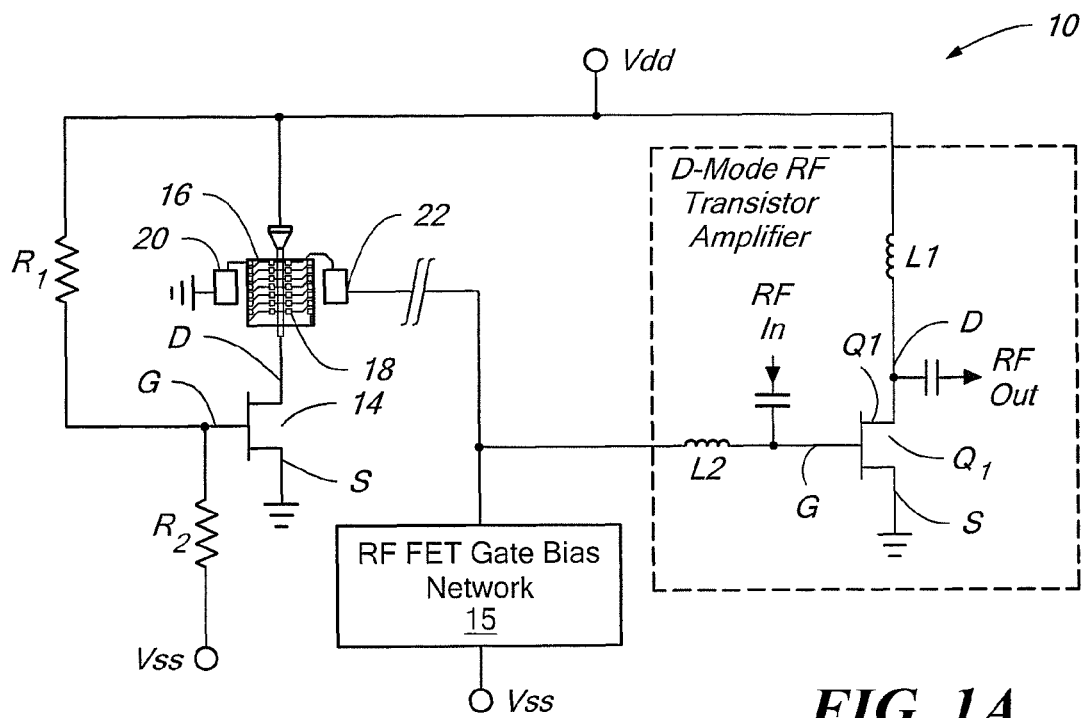
FIG. 1A represents the amplifier of FIG. 1 during normal operation.
Figure 1B:
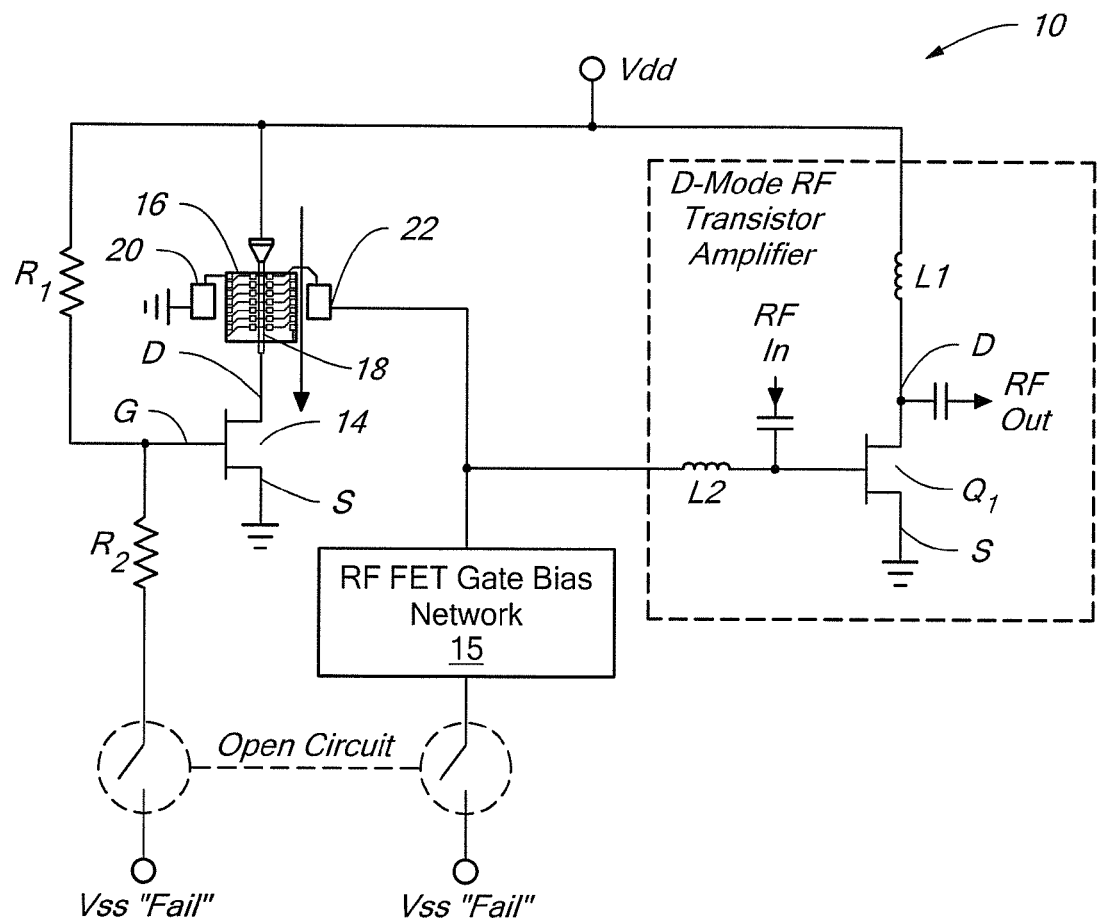
FIG. 1B represents the amplifier of FIG. 1 when there is a failure in a negative supply voltage used by such amplifier.

The thermopile 16 is here, for example, the type described in U.S. Pat. No. 7,670,045 issued Jun. 18, 2004 assigned to same assignee as present invention During normal operation (FIG. 1A), the gate electrode of the switch transistor 14 is electrically coupled to the supply of the negative reference potential VSS turning "off" both the switch transistor 14 and supply current through the heating element 18; whereas, during a failure of the supply of the negative reference potential Vss, as represented in FIG. 1B as an open circuit, the voltage at the gate electrode (G) of the switch transistor 14 floats upward towards the positive reference potential Vdd because of resistor R1 thereby turning the switch transistor 14 "on" allowing current to flow through the heating element 18 to produces, by the Seebeck effect, a negative potential at the second terminal 22 turning "off" the output transistor Q1. It is noted that the resistance looking into the thermopile second terminal 22 is designed to be very large so it will not interfere with normal operation of the bias circuit 15.

A number of embodiments of the disclosure have been described. Nevertheless, it will be understood that various modifications may be made without departing from the spirit and scope of the disclosure. For example, the resistors R1 and R2 may be omitted or other pull up arrangements may be used. Accordingly, other embodiments are within the scope of the following claims.

What is claimed is:

1. An amplifier, comprising:
   a depletion mode output transistor;
   a bias circuit coupled to a gate electrode of the transistor and to a negative voltage supply; and
   a thermopile network coupled to the gate electrode of the output transistor to bias the output transistor to an "off" condition in the event of a sensed failure of the negative supply voltage.

2. The amplifier recited in claim 1 wherein the depletion mode output transistor, the bias circuit and the thermopiles are formed on a common integrated circuit substrate.

3. The circuit recited in claim 1 wherein the thermopile network comprises:
   a switch transistor; and
   a thermopile having:
      a heating element coupled between: the supply of a positive reference potential; and a drain electrode of the depletion mode switch transistor;
      a first terminal connected to ground; and
      a second terminal coupled to: the gate electrode of the output transistor; and the bias circuit, such second electrode producing a potential negative relative to a potential produced at the first terminal when current passes through the heating element.

4. The amplifier recited in claim 3 wherein, during normal operation, the gate electrode of the switch transistor is electrically coupled to the supply of the negative reference potential turning "off" both the switch transistor and supply current through the heating element whereas, during a failure of the supply of the negative reference potential, voltage at the gate electrode of the switch transistor floats upward towards the positive reference potential turning the switch transistor "on" allowing current to flow through the heating element to produces a negative potential at the second terminal turning "off" the output transistor.

5. An amplifier, comprising:
   a depletion mode output transistor having: a drain electrode coupled to a voltage supply having a positive reference potential relative to ground; a source electrode coupled to ground; and a gate electrode fed by a signal to be amplified by the output transistor;
   a depletion mode switch transistor having a gate electrode coupled to a supply of a negative reference potential and a source electrode coupled to ground;
   a dc bias circuit coupled to the gate electrode of the depletion mode output transistor;
   a thermopile having:
      a heating element coupled between: the supply of the positive reference potential; and a drain electrode of the depletion mode switch transistor;
      a first terminal connected to ground; and
      a second terminal coupled to: the gate electrode of the output transistor; and
   the bias circuit, such second electrode producing a potential negative relative to a potential produced at the first terminal when current passes through the heating element; and
   wherein, during normal operation, the gate electrode of the switch transistor is electrically coupled to the supply of the negative reference potential turning "off" both the switch transistor and supply current through the heating element whereas, during a failure of the supply of the negative reference potential, voltage at the gate electrode of the switch transistor floats upward towards the positive reference potential turning the switch transistor "on" allowing current to flow through the heating element to produces a negative potential at the second terminal turning "off" the output transistor.

* * * * *